United States Patent [19]

Ibuchi et al.

[11] Patent Number: 5,084,726
[45] Date of Patent: Jan. 28, 1992

[54] COPYING MACHINE

[75] Inventors: Yoshiaki Ibuchi, Nara; Naoyuki Kamei, Yamatokoriyama, both of Japan

[73] Assignee: Sharp Kabushiki Kaisha, Osaka, Japan

[21] Appl. No.: 628,891

[22] Filed: Dec. 14, 1990

[30] Foreign Application Priority Data

Dec. 14, 1989 [JP] Japan .................. 1-325531
Dec. 29, 1989 [JP] Japan .................. 1-342515

[51] Int. Cl.$^5$ ............................. G03B 27/52
[52] U.S. Cl. ............................. 355/40; 355/43; 355/46; 355/244
[58] Field of Search .............. 355/40, 43, 46, 244

[56] References Cited

U.S. PATENT DOCUMENTS

| | | |
|---|---|---|
| 4,043,656 | 8/1977 | Cherian ..................... 355/244 |
| 4,120,580 | 10/1978 | Mailloux et al. .............. 355/244 |
| 4,247,192 | 1/1981 | Komori et al. ............... 355/46 X |
| 4,255,040 | 3/1981 | Weigl et al. .................. 355/244 |
| 4,533,237 | 8/1985 | Stockburger et al. ........... 355/40 |
| 4,537,497 | 8/1985 | Masuda ........................ 355/244 |
| 4,588,286 | 5/1986 | Stockburger et al. ........... 355/40 |
| 4,636,062 | 1/1987 | Ohno et al. ................... 355/43 |
| 5,016,045 | 5/1991 | Watanabe ..................... 355/43 |

*Primary Examiner*—Richard A. Wintercorn
*Attorney, Agent, or Firm*—David G. Conlin

[57] ABSTRACT

A copying machine using a slide projector, in which the slide projector is situated such that its light path does not coincide with that of the optical device so as to secure a smooth circulation of cooling air through the copying machine. The lack of coincidence of the optical paths is compensated by adjusting the position of a photosensitive sheet with respect to that of an exposure plate so as to effect the reliable formation of an image whether light is reflected from a document placed on a document table or projected through a slidefilm by a slide projector.

6 Claims, 5 Drawing Sheets

COPYING MACHINE

BACKGROUND OF THE INVENTION

1. Field of the Invention

The present invention relates to a copying machine which forms an image by directing light reflected from a document or transmitted through a slidefilm onto a photosensitive sheet.

2. Description of the Prior Art

In recent years, there have been developed copying machines capable of copying images formed in slidefilms. Two methods for copying from slidefilms are known. In one method, the entire surface of a stationary photosensitive material is exposed to light transmitted through a slidefilm. In the other method, a slide projector is mounted on the document table of a document scanning type copying machine, and the slide projector is used to project light transmitted through a slidefilm into a Fresnel lens, the projected light being directed onto a photosensitive material by means of a scanning type optical device to subject the photosensitive material to slit exposure for forming an image thereon.

However, the former method has the problem that the size of the apparatus tends to increase. On the other hand, with the latter method, the loss of optical brilliancy is great and, since the slide projector is mounted on the document table, there is a possibility of scratching, breaking or causing other damage to the document table. Therefore, it is not a practical method. In view of such problems, there has been proposed a method in which a slide projector is detachably mounted in a copying machine and light projected through a slidefilm by the slide projector is transmitted directly onto a photosensitive material to expose the photosensitive material for forming an image thereon.

As an example, in a copying machine which forms an image by superimposing and pressing a photosensitive sheet coated with microcapsules containing photohardening materials and coloring dyes onto an image receiving sheet coated with developer that develops colors by reacting with the coloring dyes, a slide projector is detachably mounted in such a way that the light transmitted through a slidefilm is projected directly onto the photosensitive sheet, and the light path of the slide projector is made to coincide with the light path of the reflected light from the document on the document table just before reaching the photosensitive sheet. There is also provided, at a position where the light path of the reflected light from the document meets the light path of the light projected by the slide projector, a movable mirror which selects either the reflected light from the document or the slide projector light and directs the selected light to the photosensitive sheet. The movable mirror is movable between a position where the light reflected from the document and passed through a lens is reflected for projection onto the photosensitive sheet and a position where the light transmitted through the slidefilm and projected by the slide projector is allowed to be projected directly onto the photosensitive sheet.

Since the slide projector is mounted so as to be positioned on an extension produced from a portion of the light path of the document reflected light that is directed by the movable mirror to the exposure position on the photosensitive sheet, the mounting position of the slide projector is approximately at the same height as that of the optical device of the copying machine.

When the slide projector is mounted in the copying machine, the light path extending from the light source of the slide projector, passing through the slidefilm, and reaching the photosensitive sheet loaded in the copying machine is formed by the selective movement of the movable mirror. The slidefilm mounted in a movable slidefilm holder is moved to a prescribed position, and the light from the light source is projected through the slidefilm, a slit, and a lens onto the exposure position of the photosensitive sheet for slit exposure of the photosensitive sheet.

In an image forming apparatus using a photosensitive sheet and the image receiving sheet, since the sensitivity of the photosensitive sheet is lower than that of the photoconductor drum used in a conventional copying machine, a greater amount of exposure is needed. As a result, the temperature of the light source increases considerably, which in turn causes the temperature of the document table and the optical device to increase considerably. To prevent such heating, cooling of the light source is provided from the vicinity thereof along with cooling by outside air introduced from one side of the copying machine and circulated through to the other side thereof.

However, since the slide projector is mounted in one side of the copying machine and approximately at the same height as that of the optical device, as described previously, the air circulation path of an optical device cooling fan, which is usually mounted on the side of the copying machine nearer to the scanning start position side of the optical device, becomes blocked by the slide projector mounted in position, thus preventing smooth circulation of cooling air through the copying machine and decreasing the cooling efficiency in the area of the optical device and the document table.

SUMMARY OF THE INVENTION

The copying machine of this invention, which overcomes the above-discussed and numerous other disadvantages and deficiencies of the prior art, comprises an optical device which moves in parallel with a document placed on a document table to scan the document for exposure and projects the light reflected from the document onto the photosensitive sheet being transported along the exposure plate, a cooling fan for cooling the optical device, a slide projector which is mounted on one side of the copying machine in such a way that the light transmitted through a slidefilm is projected, through a different light path from the light path of the optical device, directly onto the photosensitive sheet being transported along the exposure plate, and a switching means for switching over the exposure plate between a position orthogonal to the light path of the optical device and a position orthogonal to the light path of the slide projector.

In a preferred embodiment, the slide projector is mounted at a position lower than the optical device.

In a preferred embodiment, the cooling fan is fixed on the side of the copying machine opposite from the side thereof where the slide projector is mounted.

In a preferred embodiment, the cooling fan moves in integral fashion with the optical device.

In a preferred embodiment, the exposure plate is switched over by the switching means so that the exposure position of the photosensitive sheet being transported along the exposure plate, whether exposed to the light reflected from the document or the light transmitted through the slidefilm, is at the same distance from the position at which the photosensitive sheet is superimposed and pressed on the image receiving sheet.

In a preferred embodiment, the photosensitive sheet is delivered from a photosensitive sheet cartridge mounted in the copying machine, is passed through the position along the exposure plate and then through the pressing position with the image receiving sheet, and is taken up onto a prescribed takeup shaft, wherein the exposure plate is switched over by the switching means so that the length of the photosensitive sheet delivered from the photosensitive sheet cartridge and extending to the takeup point on the takeup shaft does not vary.

Thus, in the copying machine of the present invention, since the light path of the slide projector does not coincide with the light path of the optical device, there is provided an improved circulation of air through the copying machine by the cooling fan mounted at the same height as that of the optical device. Though the path of the light transmitted through the slidefilm does not coincide with that of the document reflected light in the copying machine, the photosensitive sheet transported along the exposure plate is switched over by a switching means for the exposure plate between a position orthogonal to the optical axis of the document reflected light and a position orthogonal to the light transmitted through the slidefilm. This assures reliable formation of an image whether copying the document placed on the document table or the slidefilm. Further, even when the slide projector is mounted, circulation of air from the cooling fan for cooling the optical device of the copying machine is assured throughout the entire portion of the optical device, thus achieving the same cooling effect as when copying a document image.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
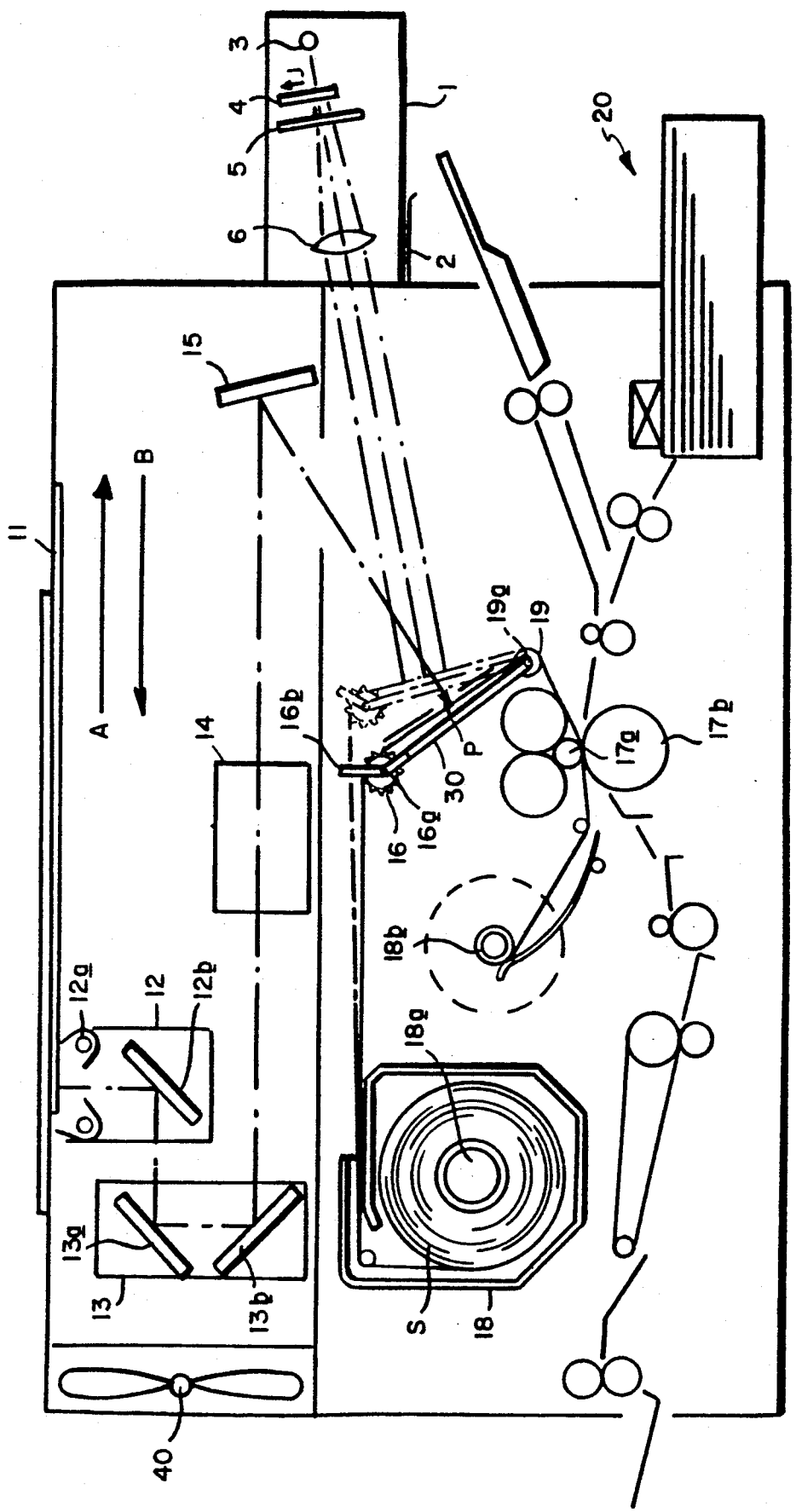
FIG. 1 is a diagrammatic structural view showing a copying machine in Example 1 of the present invention.

FIG. 1 is a diagrammatic structural view showing a copying machine in Example 1 of the present invention. In this example, there are used a photosensitive sheet consisting of a film formed from polyester or the like and coated with microcapsules containing coloring dyes; and an image receiving sheet coated with developer which causes the coloring dyes to develop colors.

A pair of pressure rollers 17a and 17b are disposed in approximately the middle portion of the copying machine. To one side of the pair of pressure rollers 17a and 17b, there is mounted a photosensitive sheet cartridge 18 which is detachable from the copying machine. The photosensitive sheet cartridge 18 has a supply shaft 18a and a takeup shaft 18b, with a fresh photosensitive sheet S rolled on the supply shaft 18a. The photosensitive sheet S delivered from the photosensitive sheet cartridge 18 is passed through a prescribed path route in the copying machine, and is used for the formation of an image. After use, the photosensitive sheet is taken up onto the takeup shaft 18b. The photosensitive sheet delivered from the photosensitive sheet cartridge 18 is loaded onto a tractor roller 16 disposed above the pressure rollers 17a and 17b, and is transported along an exposure plate 30 which is placed in a slanting position and whose slanting angle is switchable. The photosensitive sheet is further loaded onto a guide roller 19 disposed under the exposure plate 30, is passed between the pair of pressure rollers 17a and 17b, and is taken up onto the takeup shaft 18b.

Figure 2A:
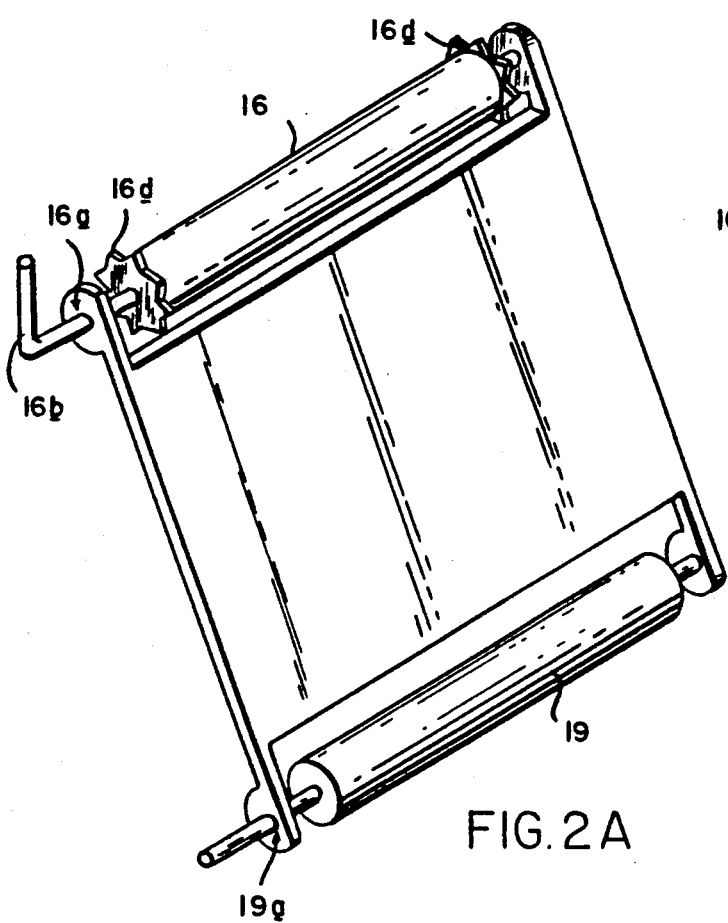
FIG. 2(A) is a perspective view illustrating a switching means for an exposure plate of the copying machine.

As shown in FIG. 2(A), the tractor roller 16 is provided with sprockets 16d for automatically loading the photosensitive sheet when the photosensitive sheet cartridge is mounted. The sprockets 16d are provided in such a way as not to interfere with the transportation of the photosensitive sheet except at the time of auto loading.

On the top surface of the copying machine, a document table 11 is mounted which is formed from glass or other material having good light transmittance and on which a document to be copied is placed. Disposed beneath the document table 11 is an optical device comprising a scanning unit 12 having a light source 12a and a mirror 12b; a mirror unit 13 having mirrors 13a and 13b; a lens 14; and a mirror 15. The scanning unit 12 and the mirror unit 13 are movable in both directions in parallel with the document table 11 and, when moving in the direction shown by arrow A, scan the document placed on the document table 11 for exposure, the light reflected from the document being directed, via the mirrors 12b, 13a and 13b, the lens 14, and the mirror 15, onto a prescribed exposure position P on the exposure plate 30 placed in a prescribed slanting position. At this time, the exposure plate 30 is slanted by means of a prescribed switching means in such a way as to be positioned orthogonal to the document light reflected by the mirror 15. The mirror unit 13 moves at a speed half that of the scanning unit 12, thus always keeping constant the distance from the document to the exposure position P. The lens 14 is movable in directions along its optical axis, and by adjusting the movement of the lens 14, the copy magnification can be set at a desired ratio ranging from 50 to 200%. On the side of the copying machine opposite from the direction in which the optical device is moved during the scanning for exposure, there is mounted a cooling fan 40 to prevent the optical device and the document table 11 from being heated by the light source 12a. The cooling fan 40 causes outside air to flow in arrow directions A or B for cooling the optical device and the document table 11.

On the side of the copying machine toward which the optical device moves during the scanning for exposure, there is provided a swingable shutter 2. When the shutter 2 is turned to rest in a horizontal position, a portion in the side of the copying machine is opened. With the shutter 2 resting in the horizontal position, the slide projector 1 is mounted on the shutter 2. The shutter 2 is positioned slightly lower than the optical device so that the light from the light source of the slide projector 1 mounted in position can be projected directly onto the exposure position P on the exposure plate 30 placed in a prescribed slanting position by a prescribed switching means. Therefore, the air provided by the cooling fan 40 for cooling the document table 11 and the optical device is allowed to smoothly flow through the copying machine without being blocked by the mounted slide projector 1.

The slide projector 1 has a light source 3, a slide holder 4, a slit 5, and a lens 6. The light source 3 uses, for example, a globular halogen tungsten lamp. A slidefilm is mounted in the slide holder 4. The slide holder 4 is movable in arrow direction J. The light from the light source 3 is passed through the slidefilm mounted in the slide holder 4 moving in arrow direction J, and further through the slit 5 and the lens 6, and is projected directly onto the exposure plate 30 placed in the prescribed slanting position.

Figure 2B:
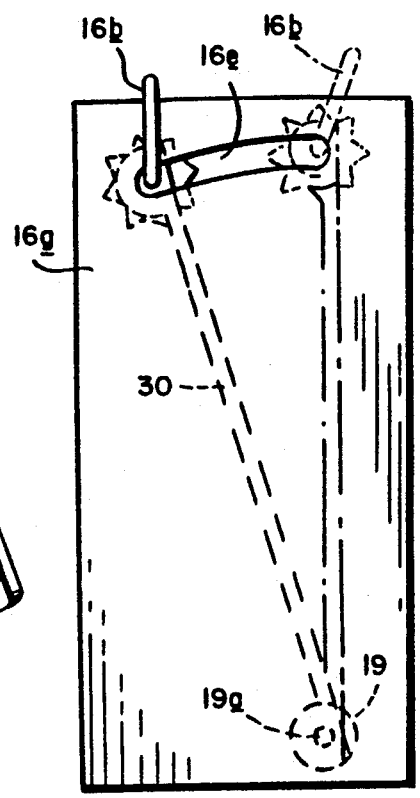
FIG. 2(B) is a side view thereof.

As shown in FIG. 2(A), the exposure plate 30, onto which the light either reflected from the document on the document table 11 or projected by the slide projector 1 is constructed in such a way that both ends of its lower end portion are supported swingably on the respective ends of a support shaft 19a of a guide roller 19 while both ends of its upper end portion are attached to the respective ends of the support shaft 16a of the tractor roller 16. One end of the support shaft 16a of the tractor roller 16 is provided with a lever portion 16b bent upward which, as shown in FIG. 2(B), is fitted through one of elongated holes 16e respectively formed in paired front and rear side plates 16g of the copying machine. By moving the lever portion 16b along the elongated hole 16e, the upper end portion of the exposure plate 30 is moved sideways with its lower end portion acting as the fulcrum, thereby varying the slanting angle of the exposure plate 30. The exposure plate 30 is switched over between two slanting positions, one being orthogonal to the light reflected from the document placed on the document table 11 and the other being further upright (indicated by a two-dot chain line in FIG. 2(B)) from the former slanting position and orthogonal to the light projected from the slide projector 1. At this time, the exposure position P where the light reflected from the document placed on the document plate 11 is projected onto the exposure plate 30 placed in a prescribed slanting position coincides with the exposure position P where the slidefilm transmitting light from the slide projector 1 is projected onto the exposure plate 30 placed in a position further upright from the former slanting position. Thus, the distance from the exposure position to the point on which the pressure rollers 17a and 17b apply pressure is always kept constant whether the photosensitive sheet is exposed to the light reflected from the document or to the light transmitted through the slidefilm.

Figure 3:
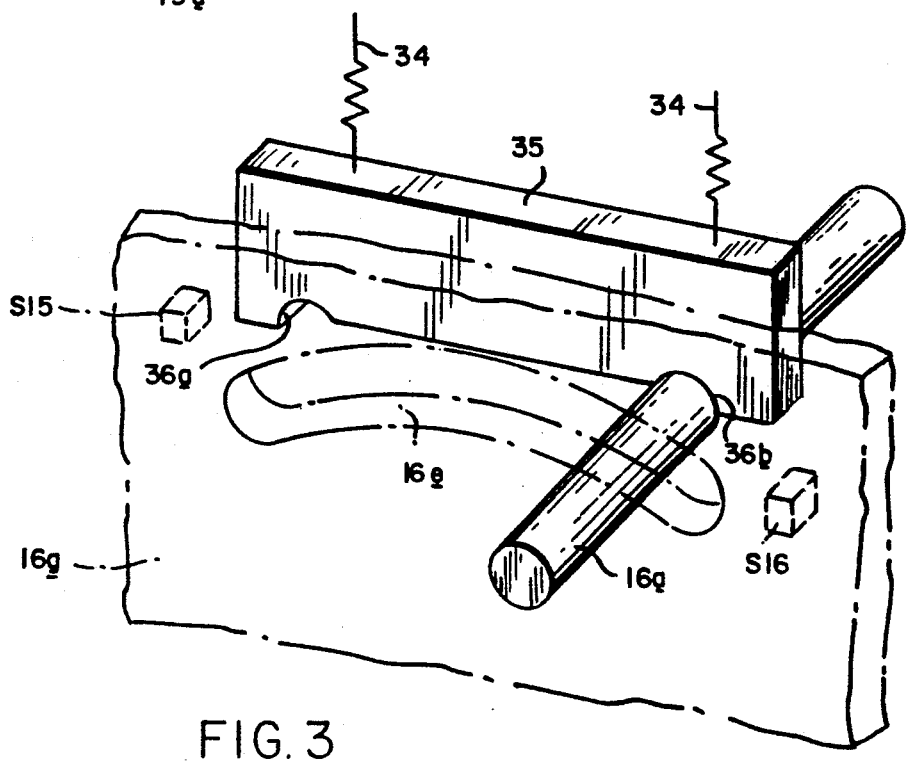
FIG. 3 is a perspective view illustrating a fixing means for the exposure plate switched over by the switching means.

As shown in FIG. 3, there is disposed above the support shaft 16a of the tractor roller 16 a fixing block 35 for fixing the support shaft 16a. The fixing block 35 has an elongated shape extending along the moving direction of the support shaft 16a and is urged downward by a pair of push springs 34. The fixing block 35 is provided with a pair of recesses 36a and 36b on the lower end face thereof. One recess 36a engages with the support shaft 16a supporting the upper end portion of the exposure plate 30 when the exposure plate 30 is placed in a slanting position for exposure to the reflected light from the document, while the other recess 36b engages with the support shaft 16a supporting the upper end portion of the exposure plate 30 when the exposure plate 30 is positioned for exposure to the light transmitted through the slidefilm. With the recess 36a or 36b engaging with the support shaft 16a, the support shaft 16a is fixed in that engaged position.

When the support shaft 16a is fixed in a position engaged with the recess 36a or 36b of the fixing block 35, the fixed state is detected by a sensor S15 or S16. Based on the detection result of the sensor S15 or S16, the slanting position of the exposure plate 30 is detected to determine whether it is a copy mode for a document placed on the document table 11 or a copy mode for a slidefilm by the slide projector 1.

A paper feed section 20 for feeding image receiving sheets into the copying machine is provided in the lower part of the same side of the copying machine as where the slide projector 1 is mounted.

When the photosensitive sheet S positioned on the exposure plate 30 is exposed to the light reflected from the document or transmitted through the slidefilm, the microcapsules are selectively hardened to form a latent image corresponding to the document or slidefilm image. When exposure is performed at the exposure position P on the exposure plate 30, the pressure rollers 17a and 17b are driven to transport the photosensitive sheet S and draw it out from the photosensitive sheet cartridge 18. The exposed portion of the photosensitive sheet is then fed to the pressure rollers 17a and 17b, and superimposed on an image receiving sheet fed from the paper feed section 20 for pressing together by the pressure rollers 17a and 17b. This causes unhardened microcapsules to rupture and the coloring dyes contained therein to flow out. The coloring dyes react with the developer on the image receiving sheet to develop colors and form an image on the image receiving sheet.

Example 2

Figure 4:
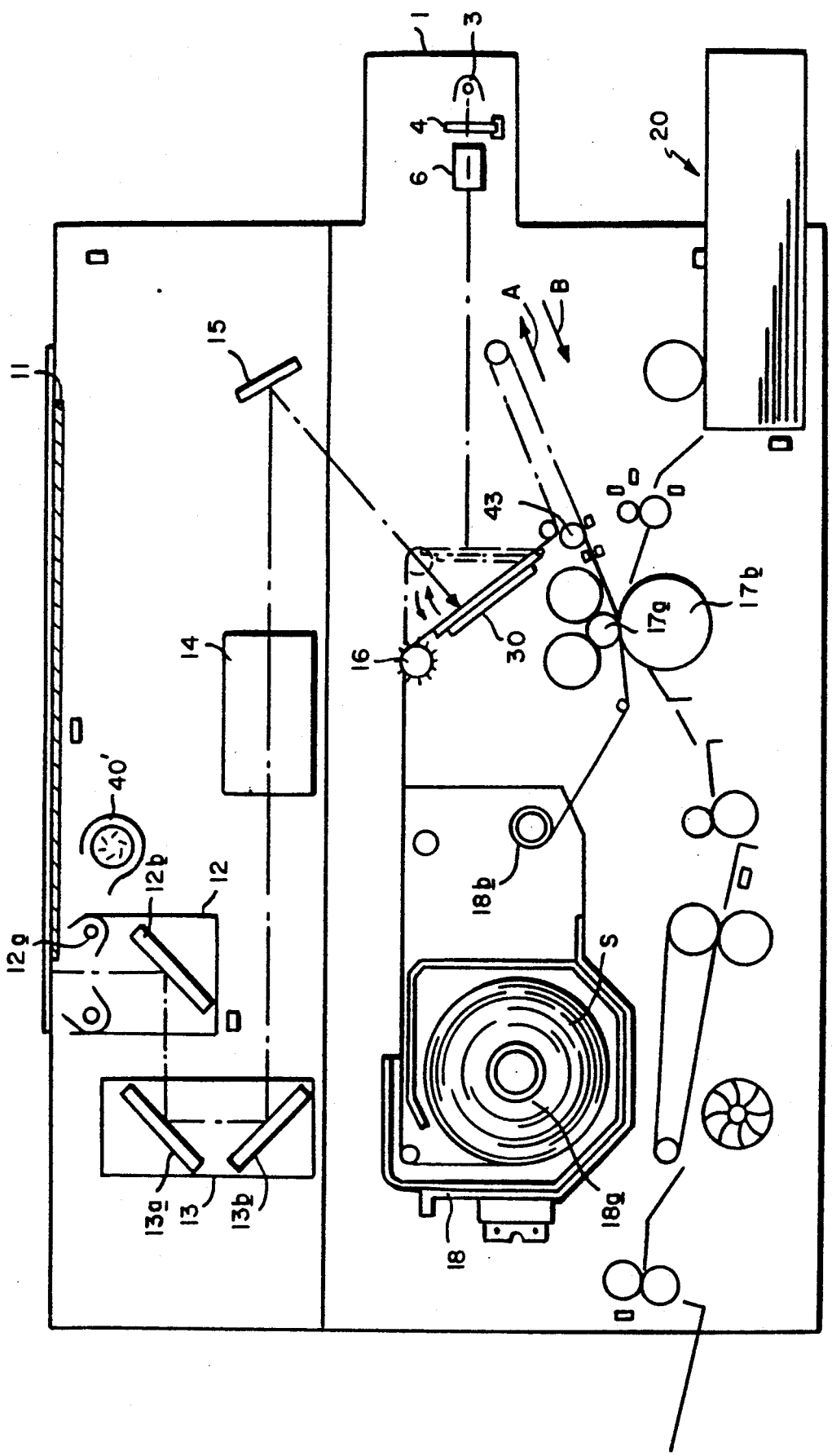
FIG. 4 is a diagrammatic structural view showing a copying machine in Example 2 of the present invention.

FIG. 4 shows a diagrammatic structural view showing a copying machine of Example 2. In the copying machine of this example, a cooling fan 40' is mounted on the scanning unit 12 of the optical device, the cooling fan 40' being movable in integral fashion with the scanning unit 12.

Also, the slide projector 1 is mounted on the copying machine in such a way that the light transmitted from a slidefilm is projected in a horizontal direction.

Below the exposure plate 30, there is provided a buffer roller 43 for moving the photosensitive sheet transported along the exposure plate 30 in a direction orthogonal to the transporting direction from the photosensitive sheet cartridge 18 to the tractor roller 16. The buffer roller 43 moves in such a direction as to deliver the photosensitive sheet when the photosensitive sheet is being exposed, and moves in such a direction as to allow the photosensitive sheet to be transported by the pressure rollers 17a and 17b in synchronism with the transport timing of the image receiving sheet after the exposure is completed.

Figure 5:
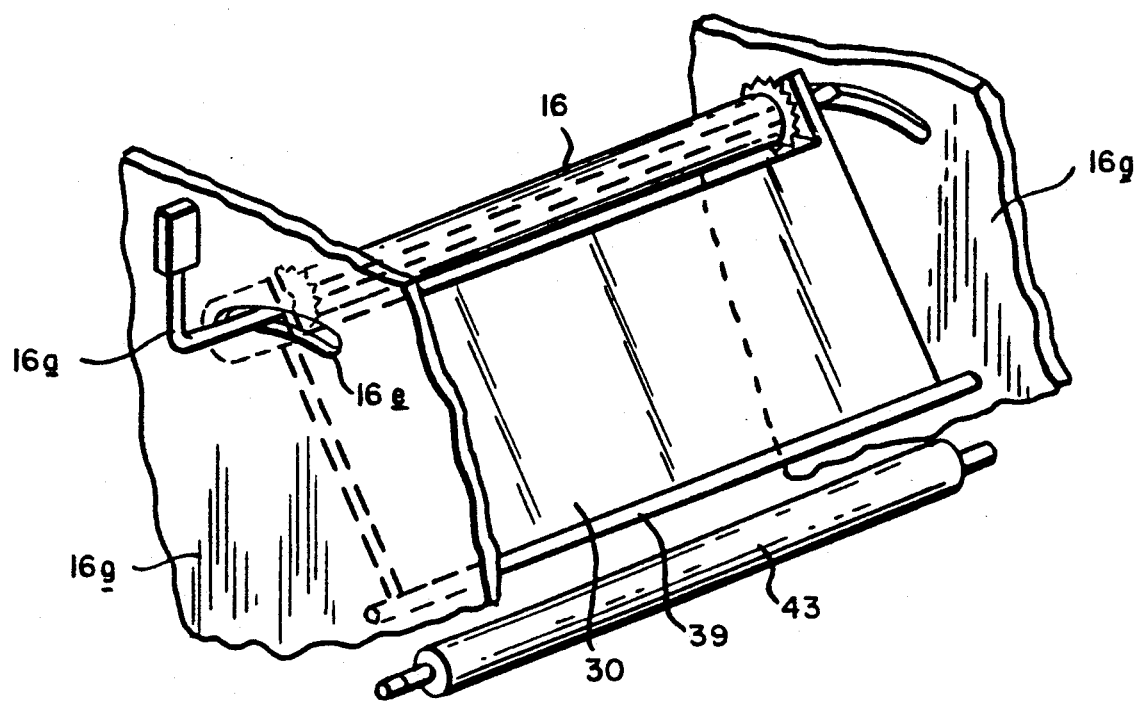
FIG. 5 is a perspective view illustrating a switching means for an exposure plate of the copying machine.

As shown in FIG. 5, the exposure plate 30 is so constructed that the lower end portion thereof above the buffer roller 43 is supported swingably on the front and rear side plates 16g via the support shaft 39. The upper end portion of the exposure plate 30 is attached to the support shaft 16a of the tractor roller 16, as in the foregoing example, and the support shaft 16a is fitted through the elongated hole 16e formed in the side plates 16g. One end of the support shaft 16a fitted through the elongated hole 16e in one side plate 16g is bent upward to form a lever portion 16b.

The other structural configuration of this example is the same as that of the copying machine of the foregoing Example 1.

In the copying machine of this example as well, the exposure plate 30 is moved to a different slanting position when the light reflected from the document on the document table 11 is projected, compared with when the light transmitted from the slidefilm is projected from the slide projector 1. In either case, the exposure position P on the photosensitive sheet comes at the same position on the exposure plate 30.

Example 3

Figure 7:
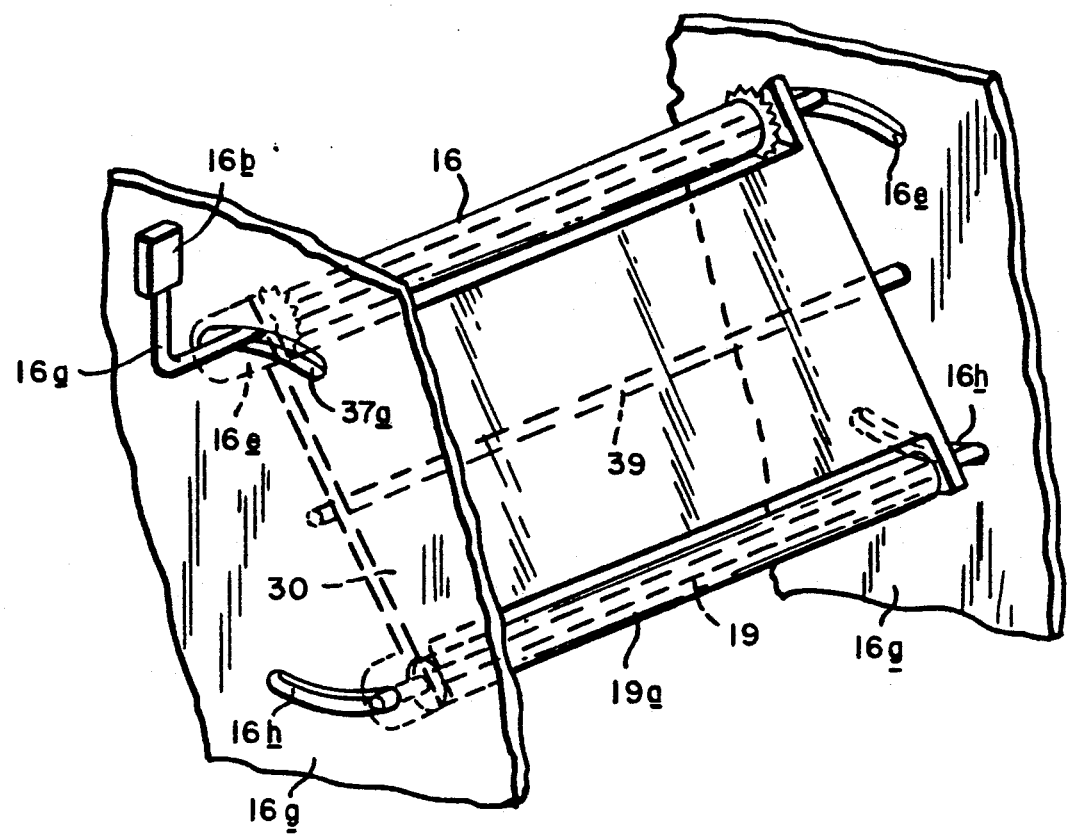
FIG. 7 is a perspective view illustrating a switching means for an exposure plate of the copying machine.
Figure 6:
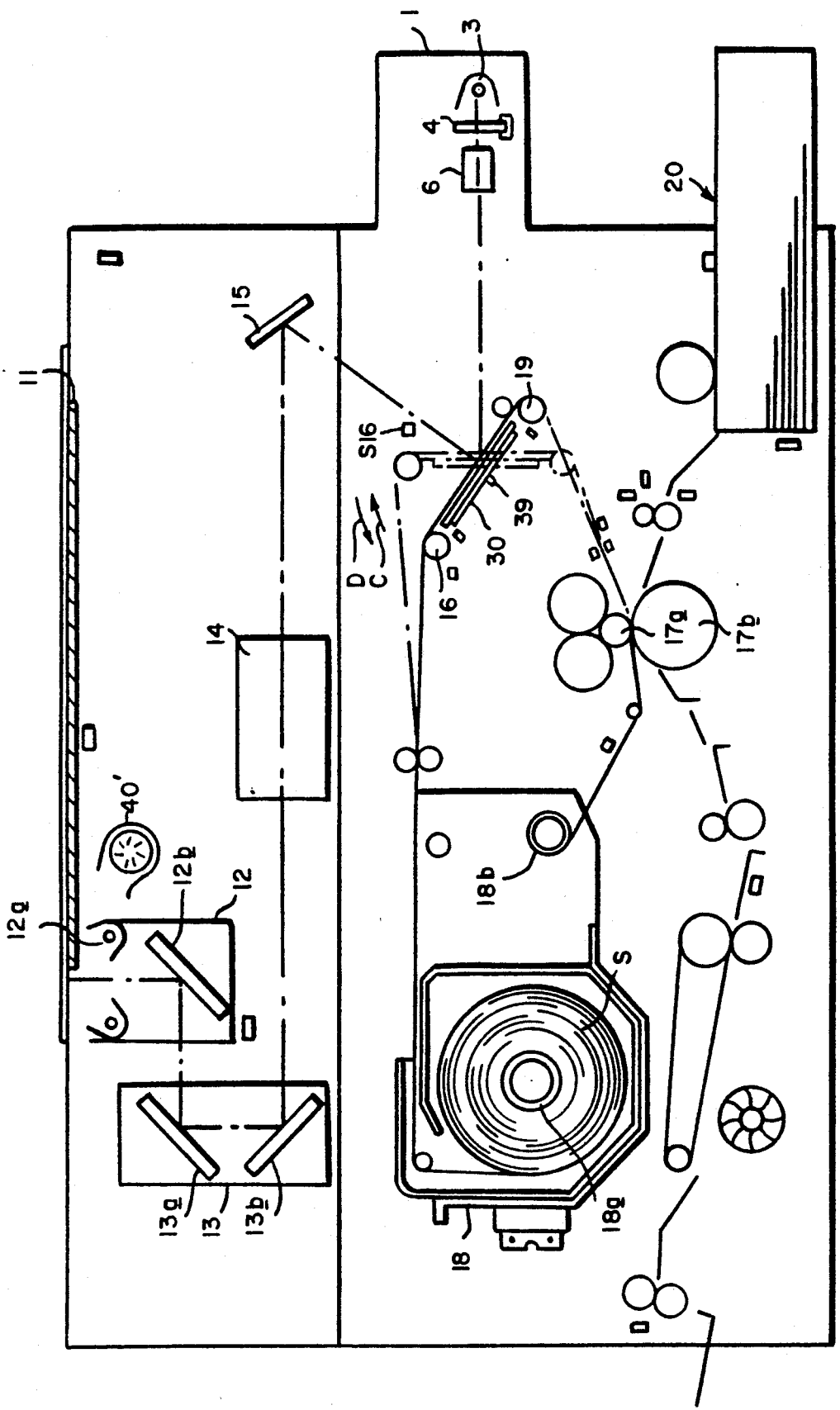
FIG. 6 is a diagrammatic structural view showing a copying machine in Example 3 of the present invention.

In the copying machine of this example, as shown in FIGS. 6 and 7, the exposure plate 30 is supported swingably on the front side plate 16g and the rear side plate 16g via a support shaft 39 provided horizontally along the longitudinal center of the exposure plate 30. The guide roller 19 is supported on the lower end portion of the exposure plate 30, as in the copying machine of the foregoing Example 1. The support shaft 19a of the guide roller 19 is slidably fitted through elongated holes 16h formed in the lower parts of the pair of front and rear side plates 16g. The tractor roller 16 is supported on the upper end portion of the exposure plate 30, as in the foregoing examples, the support shaft 16a of the tractor roller 16 being slidably fitted through the elongated holes 16e formed in the pair of front and rear side plates 16g, one end of the support shaft 16a having a lever portion 16b. The other structural configuration of this example is the same as that of the copying machine of the foregoing Example 2.

In the copying machine of this example as well, the exposure plate 30 is moved to a different slanting position when the light reflected from the document on the document table 11 is projected, compared with when the light transmitted from the slidefilm is projected from the slide projector 1, so that the exposure plate 30 is always positioned orthogonal to the projected light. In either case, light is projected onto the portion of the photosensitive sheet positioned at the fulcrum of the exposure plate 30 supported on the support shaft 39. Therefore, the exposure position P on the photosensitive sheet is always at the same position on the exposure plate 30.

Also, since the exposure plate 30 turns with the longitudinal center thereof as the fulcrum, the length of the photosensitive sheet, from the point at which it is delivered from the photosensitive sheet cartridge 18 for loading on the exposure plate 30 to the point at which it is taken up onto the takeup shaft 18b after passing through the pressure rollers 17a and 17b, does not vary in whatever slanting position the exposure plate 30 is placed. Therefore, when the slanting condition of the exposure plate 30 is changed by switching between the document copy mode and the slidefilm copy mode, there is no possibility that the photosensitive sheet loaded on the exposure plate 30 will slack or be subjected to tensile stress.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A copying machine in which light is projected onto a photosensitive sheet being transported along an exposure plate to form a latent image thereon and the photosensitive sheet with the latent image formed thereon is superimposed and pressed on an image receiving sheet coated with developer to form an image on the image receiving sheet, comprising:
   an optical device which moves in parallel with a document placed on a document table to scan the document for exposure and projects the light reflected from the document onto the photosensitive sheet being transported along the exposure plate;
   a cooling fan for cooling the optical device;
   a slide projector which is mounted on one side of the copying machine in such a way that the light transmitted through a slidefilm is projected, through a different light path from the light path of the optical device, directly onto the photosensitive sheet being transported along the exposure plate; and
   a switching means for switching over the exposure plate between a position orthogonal to the light path of the optical device and a position orthogonal to the light path of the slide projector.

2. A copying machine according to claim 1, wherein the slide projector is mounted at a position lower than the optical device.

3. A copying machine according to claim 1, wherein the cooling fan is fixed on the side of the copying machine opposite from the side thereof where the slide projector is mounted.

4. A copying machine according to claim 1, wherein the cooling fan moves in integral fashion with the optical device.

5. A copying machine according to claim 1, wherein the exposure plate is switched over by the switching means so that the exposure position of the photosensitive sheet being transported along the exposure plate, whether exposed to the light reflected from the document or the light transmitted through the slidefilm, is at the same distance from the position at which the photosensitive sheet is superimposed and pressed on the image receiving sheet.

6. A copying machine according to claim 1, wherein the photosensitive sheet is delivered from a photosensitive sheet cartridge mounted in the copying machine, is passed through the position along the exposure plate and then through the pressing position with the image receiving sheet, and is taken up onto a prescribed takeup shaft, wherein the exposure plate is switched over by the switching means so that the length of the photosensitive sheet delivered from the photosensitive sheet cartridge and extending to the takeup point on the takeup shaft does not vary.

* * * * *